(12) United States Patent
Shiu et al.

(10) Patent No.: US 7,307,480 B2
(45) Date of Patent: Dec. 11, 2007

(54) LOW LATENCY FREQUENCY SWITCHING

(75) Inventors: Da-shan Shiu, San Jose, CA (US); Li Zhang, San Diego, CA (US); Eugene Sy, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 771 days.

(21) Appl. No.: 10/422,271

(22) Filed: Apr. 24, 2003

(65) Prior Publication Data

US 2004/0087292 A1  May 6, 2004

Related U.S. Application Data

(60) Provisional application No. 60/423,219, filed on Oct. 31, 2002.

(51) Int. Cl.
 *G01R 23/00* (2006.01)
 *H04Q 7/34* (2006.01)

(52) U.S. Cl. ......................... 331/44; 370/332
(58) Field of Classification Search ............... 331/44, 331/18; 370/322
 See application file for complete search history.

(56) References Cited

U.S. PATENT DOCUMENTS

| | | | | |
|---|---|---|---|---|
| 6,088,343 | A | 7/2000 | King | 370/329 |
| 6,389,269 | B1 * | 5/2002 | Nanni et al. | 455/93 |
| 6,459,889 | B1 | 10/2002 | Ruelke | 455/296 |
| 6,694,129 | B2 * | 2/2004 | Peterzell et al. | 455/76 |
| 2002/0019898 | A1 * | 2/2002 | Hayashi et al. | 710/110 |

FOREIGN PATENT DOCUMENTS

| | | |
|---|---|---|
| CA | 2360266 | 10/2001 |
| EP | 1102413 | 5/2001 |
| EP | 1172928 | 1/2002 |
| WO | 1213830 | 6/2002 |

* cited by examiner

*Primary Examiner*—Joseph Chang
(74) *Attorney, Agent, or Firm*—Thomas R. Rouse; Matthew J. Evans

(57) ABSTRACT

Techniques for improved low latency frequency switching are disclosed. In one embodiment, a controller receives a frequency switch command and generates a frequency switch signal at a time determined in accordance with a system timer. In another embodiment, gain calibration is initiated subsequent to the frequency switch signal delayed by the expected frequency synthesizer settling time. In yet another embodiment, DC cancellation control and gain control are iterated to perform gain calibration, with signaling to control the iterations without need for processor intervention. Various other embodiments are also presented. Aspects of the embodiments disclosed may yield the benefit of reducing latency during frequency switching, allowing for increased measurements at alternate frequencies, reduced time spent on alternate frequencies, and the capacity and throughput improvements that follow from minimization of disruption of an active communication session and improved neighbor selection.

11 Claims, 6 Drawing Sheets

LOW LATENCY FREQUENCY SWITCHING

RELATED APPLICATIONS

This application claims priority from U.S. Provisional Application Ser. No. 60/423,219, filed Oct. 31, 2002, the content of which is incorporated herein by reference in its entirety.

FIELD

The present invention relates generally to wireless communications, and more specifically to low latency frequency switching in wireless communications.

BACKGROUND

Wireless communication systems are widely deployed to provide various types of communication such as voice and data. These systems may be based on code division multiple access (CDMA), time division multiple access (TDMA), or some other modulation techniques. A CDMA system provides certain advantages over other types of systems, including increased system capacity.

A CDMA system may be designed to support one or more CDMA standards such as (1) the "TIA/EIA-95-B Mobile Station-Base Station Compatibility Standard for Dual-Mode Wideband Spread Spectrum Cellular System" (the IS-95 standard), (2) the standard offered by a consortium named "3rd Generation Partnership Project" (3GPP) and embodied in a set of documents including Document Nos. 3G TS 25.211, 3G TS 25.212, 3G TS 25.213, and 3G TS 25.214 (the W-CDMA standard), (3) the standard offered by a consortium named "3rd Generation Partnership Project 2" (3GPP2) and embodied in "TR-45.5 Physical Layer Standard for cdma2000 Spread Spectrum Systems" (the IS-2000 standard), and (4) some other standards. An example of a TDMA system is the GSM standard.

In the above named standards, the available spectrum is shared simultaneously among a number of users. Techniques such as power control and soft handoff are employed to maintain sufficient quality to support delay-sensitive services, such as voice. Data services are also available. More recently, systems have been proposed that enhance the capacity for data services by using higher order modulation, very fast feedback of Carrier to Interference ratio (C/I) from the mobile station, very fast scheduling, and scheduling for services that have more relaxed delay requirements. An example of such a data-only communication system using these techniques is the high data rate (HDR) system that conforms to the TIA/EIA/IS-856 standard (the IS-856 standard).

In contrast to the other above named standards, an IS-856 system uses the entire spectrum available in each cell to transmit data to a single user at one time, selected based on link quality. In so doing, the system spends a greater percentage of time sending data at higher rates when the channel is good, and thereby avoids committing resources to support transmission at inefficient rates. The net effect is higher data capacity, higher peak data rates, and higher average throughput.

Systems can incorporate support for delay-sensitive data, such as voice channels or data channels supported in the IS-2000 standard, along with support for packet data services such as those described in the IS-856 standard. One such system is described in a proposal submitted by LG Electronics, LSI Logic, Lucent Technologies, Nortel Networks, QUALCOMM Incorporated, and Samsung to the 3rd Generation Partnership Project 2 (3GPP2). The proposal is detailed in documents entitled "Updated Joint Physical Layer Proposal for 1xEV-DV", submitted to 3GPP2 as document number C50-20010611-009, Jun. 11, 2001; "Results of L3NQS Simulation Study", submitted to 3GPP2 as document number C50-20010820-011, Aug. 20, 2001; and "System Simulation Results for the L3NQS Framework Proposal for cdma2000 1xEV-DV", submitted to 3GPP2 as document number C50-20010820-012, Aug. 20, 2001. These, and related documents generated subsequently, are hereinafter referred to as the 1xEV-DV proposal.

Mobile stations may be designed to operate according to more than one communication standard to allow the use of the mobile station in varying geographical regions in which a single communication is not supported. A wireless communication standard may provide features for facilitating seamless handoff from one Radio Access Technology (RAT) to another. For example, the W-CDMA standard provides compressed mode to allow a mobile station to search for other radio access technologies, such as a neighboring GSM system. Compressed mode is designed to allow a time gap during communications in which forward link transmission to the mobile station is suspended, and reverse link transmission from the mobile station is not required. The mobile station may use this gap to search for alternate available systems.

It is common for various systems to be deployed at various frequencies and with various communication formats. Thus, a mobile station may need to switch from a current frequency and radio access technology to a new frequency to perform measurements to determine the availability of an alternate system. This alternate system may or may not use an alternate radio access technology. In general, it may be desirable for a mobile station to switch to a new frequency quickly to provide for improved communication performance. Furthermore, fast frequency setup may lead to reduced acquisition time, which may be an improvement to performance for any system, regardless of whether multiple radio access technologies are supported. There is therefore a need in the art for low latency frequency switching.

SUMMARY

Embodiments disclosed herein address the need for low latency frequency switching. In one embodiment, a controller receives a frequency switch command and generates a frequency switch signal at a time determined in accordance with a system timer. In another embodiment, gain calibration is initiated subsequent to the frequency switch signal delayed by the expected frequency synthesizer settling time. In yet another embodiment, DC cancellation control and gain control are iterated to perform gain calibration, with signaling to control the iterations without need for processor intervention. Various other embodiments are also presented. Aspects of the embodiments depicted may yield the benefit of reducing latency during frequency switching, allowing for increased measurements at alternate frequencies, reduced time spent on alternate frequencies, and the capacity and throughput improvements that follow from minimization of disruption of an active communication session and improved neighbor selection.

DETAILED DESCRIPTION

Figure 1:
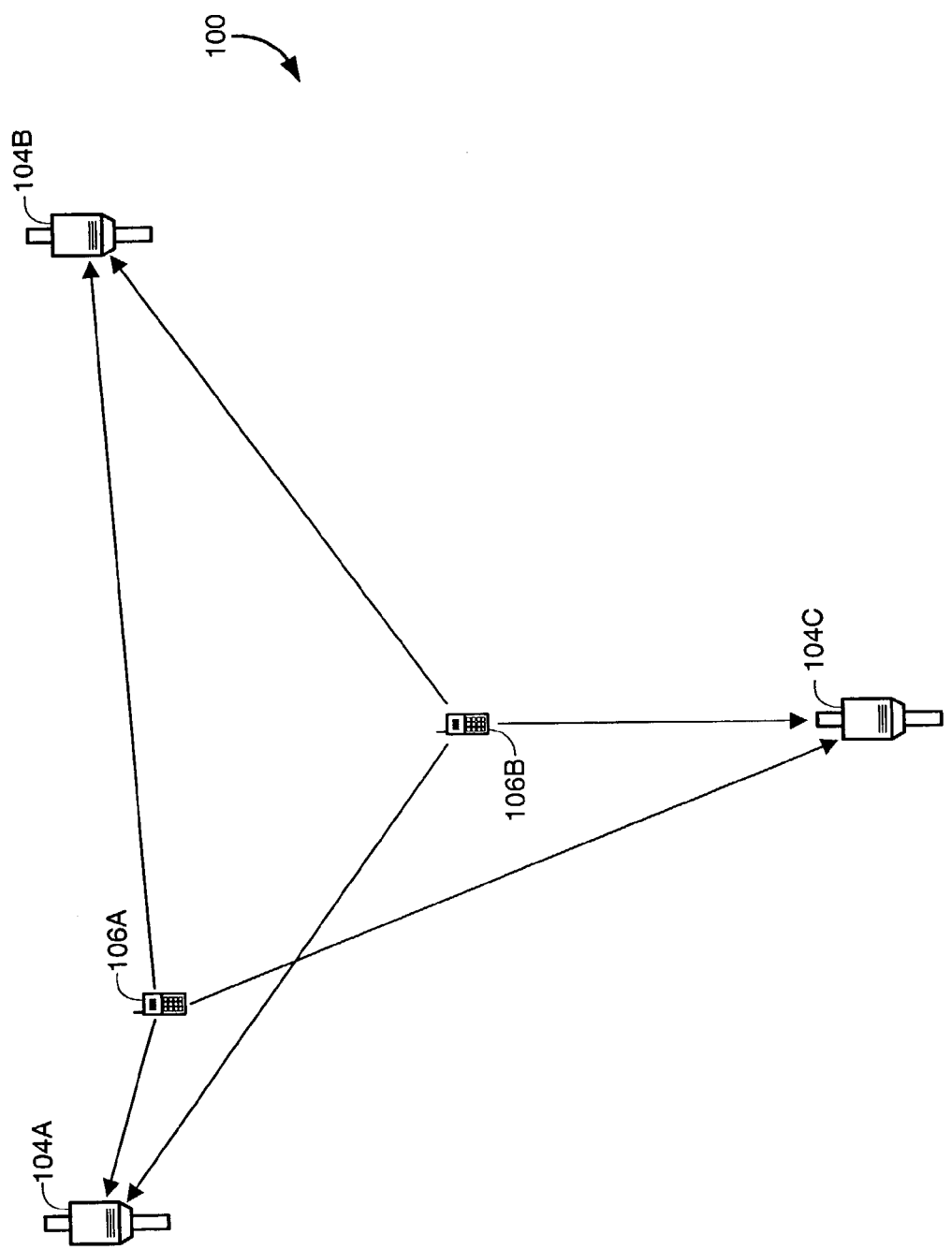
FIG. 1 is a general block diagram of a wireless communication system shown supporting a number of users.

FIG. 1 is a diagram of a wireless communication system 100 that may be designed to support one or more CDMA standards and/or designs (e.g., the W-CDMA standard, the IS-95 standard, the cdma2000 standard, the HDR specification, the 1xEV-DV proposal). In an alternative embodiment, system 100 may also deploy any wireless standard or design other than a CDMA system, such as a GSM system.

For simplicity, system 100 is shown to include three base stations 104 in communication with two mobile stations 106. The base station and its coverage area are often collectively referred to as a "cell". In IS-95 systems, a cell may include one or more sectors. In the W-CDMA specification, each sector of a base station and the sector's coverage area is referred to as a cell. As used herein, the term base station is used interchangeably with the terms access point or Node B. The term mobile station is also used interchangeably with the terms user equipment (UE), subscriber unit, subscriber station, access terminal, remote terminal, or other corresponding terms known in the art. The term mobile station further encompasses fixed wireless applications.

Depending on the CDMA system being implemented, each mobile station 106 may communicate with one (or possibly more) base stations 104 on the forward link at any given moment, and may communicate with one or more base stations on the reverse link depending on whether or not the mobile station is in soft handoff. The forward link (i.e., downlink) refers to transmission from the base station to the mobile station, and the reverse link (i.e., uplink) refers to transmission from the mobile station to the base station.

Exemplary embodiments assume base stations as the originator of signals and mobile stations as receivers and acquirers of those signals, i.e. signals on the forward link. Those skilled in the art will understand that mobile stations as well as base stations can be equipped to transmit data as described herein. The word "exemplary" is used exclusively herein to mean "serving as an example, instance, or illustration." Any embodiment described herein as "exemplary" is not necessarily to be construed as preferred or advantageous over other embodiments. In system 100, the various base stations 104 may be equipped to communicate using any of a variety of communication formats. Various radio access technologies and/or frequencies may be used. While communicating on a first frequency, it may be desirable for a mobile station 106 to switch to a second frequency. The mobile station may perform measurements on the second frequency and then return to the first frequency. For example, a mobile station 106 may handoff from one base station 104 to another. In order to handoff to a base station of a different frequency or radio access technology, it may be necessary for the mobile station to locate the new base station while concurrently communicating with the current serving base station. Therefore, the mobile station may periodically monitor for neighbor base stations on an alternate frequency.

When a mobile station is given a limited time to switch frequencies, such as when a current communication is temporarily suspended (an example is W-CDMA compressed mode), low latency frequency switching may be imperative. At a minimum, the latency of a frequency switch must be low enough to switch frequencies, perform the desired measurements at the new frequency, and then switch back to the current communication session frequency within the allotted time period. If the latency is reduced beyond the minimum necessary, any balance of allotted time may be used to increase the precision of the alternate frequency measurements, perform additional frequency searches, or a combination of both. Alternatively, if the allotted time period is not fixed, reduced frequency switching latency may allow the current communication session to be resumed sooner, thus increasing utilization of the communication resource. Low latency frequency switching thus improves system acquisition time as well as facilitates support of multiple communication formats.

Figure 2:
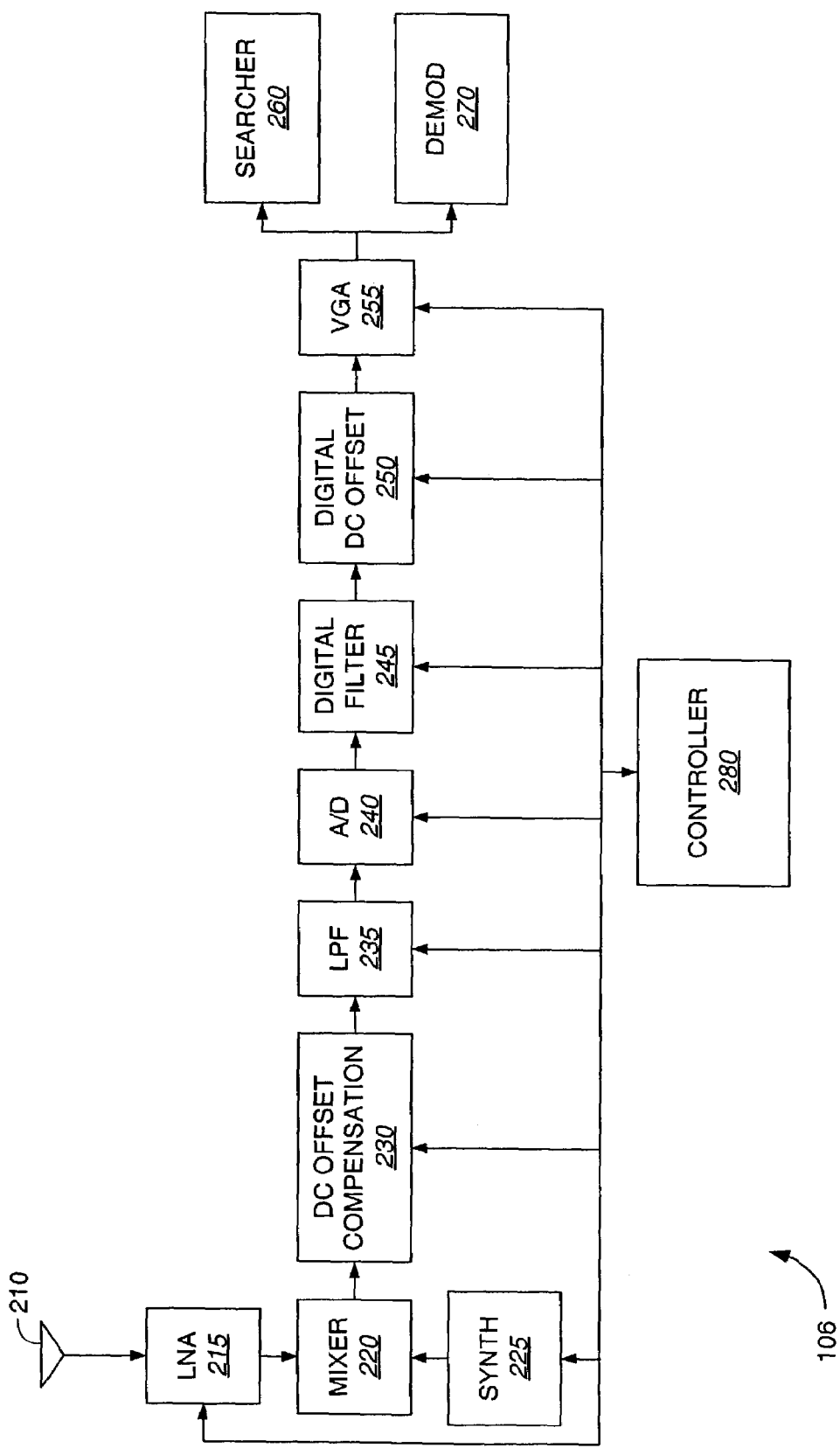
FIG. 2 is a block diagram of a portion of a mobile station.

FIG. 2 is a block diagram of a portion of a mobile station 106. The blocks depicted in this exemplary embodiment will generally be a subset of the components included in a mobile station 106. Those of skill in the art will readily adapt the embodiment shown in FIG. 2 for use in any number of mobile station configurations. In this example, a Zero Intermediate Frequency (ZIF) receiver is deployed. In alternate embodiments, various receiver architectures may be deployed. For example, a superheterodyne receiver may be deployed. A ZIF architecture is described in various examples below for clarity of discussion. The blocks shown depict one example only. Myriad combinations will be recognized by those of skill in the art, some of which are detailed further below. Those of skill in the art will readily apply the principles disclosed herein to adapt to any receiver combinations.

Forward link signals are received at antenna 210 and delivered to the receive chain starting with Low Noise Amplifier (LNA) 215. While a single antenna is shown, multiple antenna receivers are known in the art and the principles disclosed herein apply.

One or more antennas 210 may be shared with a transmit chain (not shown). An additional antenna or antennas may alternately be deployed for use by the transmit chain. Transmitted signals may be formatted according to one or more wireless system standards, such as those listed above. Examples of components that may be included in a transmit chain are amplifiers, synthesizers, filters, digital-to-analog (D/A) converters, radio frequency (RF) converters, and the like. A modulator may be deployed for formatting data and control channels for transmission in accordance with a variety of formats. A modulator may include encoders, interleavers, spreaders, and other modulators of various types.

Signals received at antenna 210 are amplified in LNA 215. LNA 215 may be a variable gain amplifier, the gain of which is specified by controller 280. In this example, LNA 215 has a discrete number of gain levels, one of which is selected at any given time by controller 280.

The amplified signal from LNA 215 is downconverted to baseband in mixer 220 using a frequency generated by synthesizer (SYNTH) 225. The frequency is generated in synthesizer 225 in response to a control signal from controller 280. Various frequency synthesis techniques are known in the art, any of which may be deployed in synthesizer 225. For example, a synthesizer may include a Phase Locked Loop (PLL) and a Voltage Controlled Temperature Compensated Crystal Oscillator (VCTCXO) to generate a carrier frequency. One component of the total latency involved in frequency switching is the time required for the synthesizer to tune to a new specified frequency and settle. Various components receiving the downconverted signal from mixer 220 are generally disabled while synthesizer 225 retunes to a new frequency, to avoid attempts to operate on non-useful data. When the frequency has settled to within a predetermined threshold, the downstream components are re-enabled. To reduce latency, exemplary techniques, detailed below, are deployed to initiate synthesizer retuning at the earliest possible time. Other techniques are deployed to re-enable the downstream components as soon as practicable. In some of these techniques, dedicated hardware is deployed to facilitate such timing, in contrast with higher latency options such as using an interrupt-driven processor.

Direct Current (DC) offset compensation block 230 is used to remove a DC component from the downconverted signal. A voltage, signaled by controller 280, may be inserted in the base band signal. The DC offset baseband signal is filtered in Low Pass Filter (LPF) 235 to remove undesired out-of-band frequencies. The filtered signal is converted to digital format in Analog to Digital (A/D) converter 240. LPF 235 and A/D 240 are shown connected to controller 280. LPF filter 235 may be configurable with different parameters, the configurations selectable for various communication formats. For example, one filter characteristic may be used for W-CDMA, while a different characteristic is used for GSM. Alternately, LPF 235 may comprise multiple filters, selectable depending on the desired communication format. Similarly, A/D converter 240 may be configurable for different operation in different modes.

The digital signal is further filtered in digital filter 245. An optional digital DC offset block 250 may be deployed to remove any DC signal not removed by DC offset compensation block 230. Variable Gain Amplifier (VGA) 255 is then deployed to amplify the digital signal for use by searcher 260 and demodulator (DEMOD) 270. VGA 255 introduces gain as directed by controller 280.

Note that the overall gain of mobile station's receiver is distributed over the various blocks just described. The gain introduced in LNA 215 and DC offset compensation in block 230 are used to prepare the baseband analog signal for A/D conversion within the dynamic range of A/D 240. VGA 255 keeps the digital signal at a level suitable for use by the searcher 260 and demodulator 270. One or more iterations may be required to initially configure these components (referred to as gain calibration) once, the synthesizer 225 has settled at a new frequency. One component of gain calibration is to initialize the Automatic Gain Control (AGC) function. Convergence time of gain calibration is another component of the overall frequency switching latency. Example techniques, detailed further below, reduce the convergence time for gain calibration.

Once the synthesizer has settled and gain calibration has occurred, frequency techniques, known in the art, are deployed to keep the synthesizer locked to the carrier frequency. AGC techniques are deployed in controller 280 to adapt the received signal to provide the desired signal level at the output of VGA 255, examples of which are detailed further below.

Searcher 260 is configurable to search for system signals for the various communication formats supported. Search techniques are well known in the art and any such technique may be deployed within the scope of the present invention. In alternate embodiments, searcher 260 may be comprised of more than one searcher, each deployed for searching one or more of the supported communication formats. In the exemplary embodiment, searcher 260 detects and measures the quality of W-CDMA or GSM signals, depending on the mode selected. An alternate embodiment may support any number of CDMA, TDMA, FDMA or other communication formats. Time spent searching for and measuring system signals is another component of overall frequency switching latency. To reduce latency, techniques detailed further below provide for initiating a search as soon as the receiver has settled and converged. In addition, the searcher may be adapted to provide a signal that the search is complete, which allows the receiver to promptly begin the process of re-tuning back to the original frequency (or, alternately, to begin retuning to an additional frequency for searching).

Similarly, demodulator 270 is configurable to demodulate signals for the various communication formats supported. Demodulation techniques are well known in the art and any such technique may be deployed within the scope of the present invention. In alternate embodiments, demodulator 270 may be comprised of more than one demodulator, each deployed for searching one or more of the supported communication formats. In the exemplary embodiment, demodulator 270 demodulates W-CDMA or GSM signals, depending on the mode selected. An alternate embodiment may support any number of CDMA, TDMA, FDMA or other communication formats. An example demodulator 270 may perform RAKE receiving, equalization, combining, deinterleaving, decoding, and various other functions as required by the format of the received signals.

Note that in all the embodiments described herein, various discrete blocks are depicted for clarity of discussion. Those of skill in the art will recognize that in alternate embodiment, shared hardware such as microprocessors or Digital Signal Processors (DSPs) may be used to perform one or more functions described, or portions thereof. Various functions may be carried out using a combination of dedicated hardware as well as shared hardware. For example, searcher 260 and demod 270 may share a common DSP, deployed to perform various demodulation, searching, and other signal processing tasks. Furthermore, one or more microprocessors may be deployed to share in the processing. Those of skill in the art will readily adapt the teachings herein to these and myriad other receiver combinations.

In the exemplary embodiment depicted in FIG. 2, a single component of each type is shown for clarity of discussion. Alternate embodiments may replicate one or more components to facilitate reception of signals corresponding to multiple communication formats. A variety of examples of such alternate embodiments follow.

Although the transmitter portion of the mobile station 106 is not shown in FIG. 2, the synthesizer 225 may be shared with the transmitter as well as with the blocks depicted. In this example, retuning the synthesizer 225 to a new frequency must wait until the transmission, utilizing synthesizer 225, is completed for the current frequency. In an alternate embodiment, a separate synthesizer (not shown) may be deployed for the transmitter, thus allowing synthesizer 225 to be retuned as soon as reception at the current frequency is completed. This may allow a reduction in frequency switch latency.

In yet another alternative, an additional receive synthesizer may be deployed (not shown). The additional receive synthesizer may be tuned to the new frequency even before reception is completed at the current frequency, allowing for further frequency switch latency reduction. A multiplexer may be deployed to select the output of either synthesizer. Other components may be replicated for different communication formats as well. For example, a complete chain of components may be deployed between the LNA 215 and the A/D converter 240 for two or more communication formats. A multiplexer may be deployed before A/D converter 240 to select the output desired. For example, it may be desirable to deploy two low pass filters 235, one configured for W-CDMA reception and the other for GSM reception. Two synthesizers 225 may be deployed, as described above, to allow the tuning of one synthesizer at the new frequency to commence while the other is used for reception at the current frequency. Two mixers 220 may be deployed accordingly, or appropriate multiplexing may be deployed to share one mixer. In similar fashion, two or more LNAs 215 may be deployed, or a single LNA may be used. In the extreme, a complete receiver structure may be deployed for each communication format, with multiplexing to select the output for delivery to searcher 260 and demodulator 270. Any subset of the components 210-255 may be replicated or shared, in this manner. In some cases, it may be desirable to deploy components specially purposed for one or more communication formats due to the varying nature of the format requirements. Or, it may be desirable to replicate otherwise shareable components in order to reduce frequency switch latency. The variety of alternate embodiments given are examples only. Those of skill in the art will readily adapt the principles disclosed herein to any of the possible component configurations.

Furthermore, as described above, a ZIF architecture is shown as an example only. Other architectures, e.g. a superheterodyne receiver, may also be deployed. A receiver may be deployed to support both ZIF and superheterodyne reception, if so desired.

Figure 3:
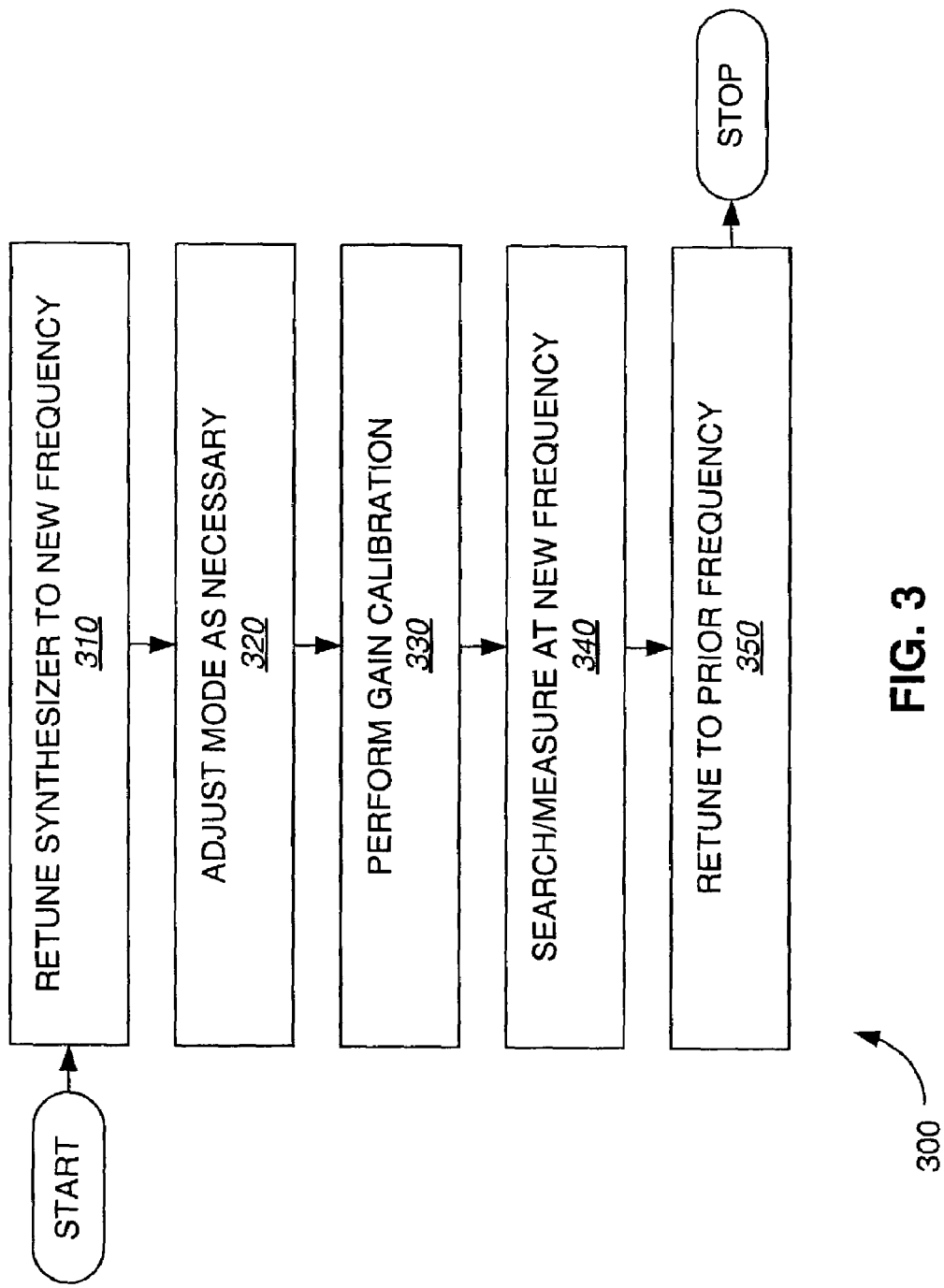
FIG. 3 is an exemplary method of frequency switching.

FIG. 3 is a flowchart of an exemplary method of frequency switching 300. Method 300 illustrates the technique of performing searching and/or other measurements at an alternate frequency, then returning to the original frequency. Although various features of method 300 are particularly suitable for interfrequency searches, as described, they may also be deployed whenever low latency frequency switching is desired, whether or not the mobile station returns to the original frequency.

Method 300 begins in step 310, where the synthesizer (such as synth 225) is retuned to a new frequency. With a typical synthesizer, there is generally some settling time required for the synthesizer to retune to the new frequency and stabilize at that frequency.

In step 320, adjust the receiver mode, as necessary. This may entail initializing one or more components for reception in the communication format that will be used at the new frequency. A processor (such as processor 550, detailed below, or another component of controller 280, for example) may program various components to adjust the mode. For example, the A/D converter may have configurable settings that may need to be altered. Or, the LNA may be initialized with a default value. Filter tap values may be programmed. Or, if multiple configurations are possible utilizing receiver components, the appropriate multiplexing options may be selected. Any number of tasks may be performed to switch from a first mode to a second mode, as will be obvious to those of skill in the art. In the exemplary embodiment, the mode change is performed subsequent to retuning the synthesizer (step 310), while the frequency is settling. This reduces the frequency switch latency whenever the mode change time is equal to or less than the frequency settling time. In an alternate embodiment, the mode change could be performed prior to synthesizer retune. In the exemplary embodiment, the receiver is configured in the first mode for W-CDMA communication and in the second mode for GSM communication. Those of skill in the art will recognize that any communication format may be supported within the scope of the present invention.

In step 330, once the frequency has stabilized to within a desired threshold, gain calibration is performed. In the exemplary embodiment, gain calibration encompasses DC offset compensation and distributing gain among the various gain blocks to optimally use the dynamic range of the A/D converter and the various processing elements that follow. As described in FIG. 2, in the exemplary embodiment, two DC offset blocks (an analog block 230 and a digital block 250) are deployed for removal of the DC component. The gain is spread across the LNA 215 and the VGA 255. This embodiment is an example only. Those of skill in the art will readily extend to the teachings herein to myriad component combinations. Once gain calibration is complete, proceed to step 340.

In step 340, the receiver has been tuned to the new frequency. Searching may be performed, or other measurements made, to determine the existence or quality of a communication resource at the new frequency. When the searching or other measurement is complete, proceed to step 350.

In step 350, retune to the prior frequency. This may be carried out using the techniques described in steps 310-330, to minimize latency in returning to the original frequency. Then the process stops. Note that method 300 may be repeated whenever a new search is desired, and multiple searches at one or more frequencies may be performed before returning to the original frequency.

Figure 4:
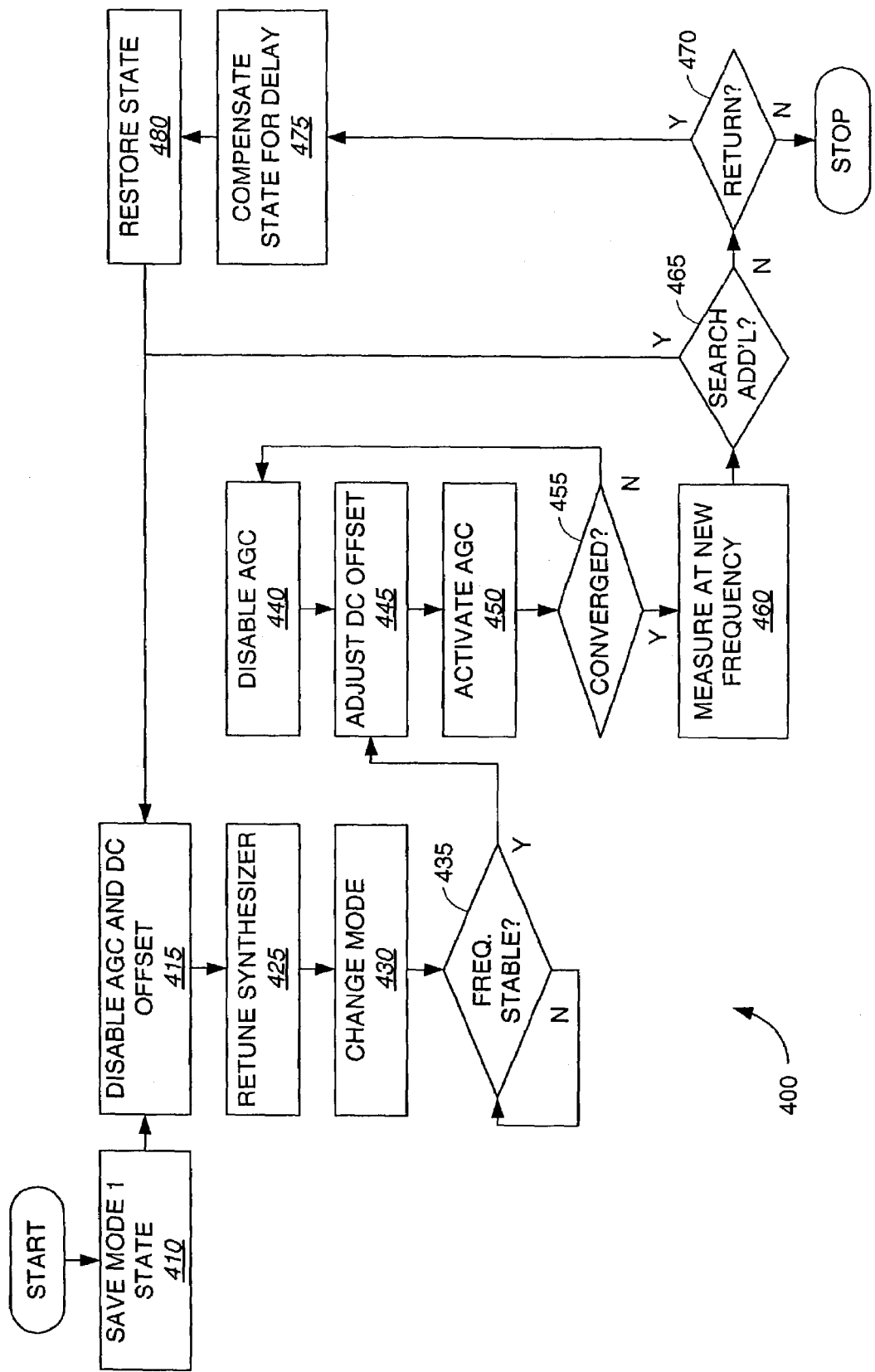
FIG. 4 is another exemplary method of frequency switching.

FIG. 4 depicts a flowchart of another example of frequency switching, method 400. Method 400 begins in step 410. The receiver will switch from the current frequency on which communication may be active, and search one or more additional frequencies. To facilitate return to the current frequency, in step 410, the current state of one or more components for operating mode are saved. In one example, mode 1 may be W-CDMA communication. The state saved may include current gain values for the LNA and digital gain, DC offset compensation values, filter tap values, or A/D parameters, for example. Those of skill in the art will recognize state to save as appropriate for the type of communication mode supported. Note that saving state is optional. It may, in some cases, reduce the frequency switch latency. Returning to the saved state is detailed further below.

In step 415, the AGC and DC offset loops are disabled. It is not necessary to run these loops during the period in which the frequency is not stable. In some cases, attempting to perform gain calibration while the frequency is settling may cause the convergence time to increase.

In step 425, retune the synthesizer to the new frequency to be searched. Proceed to step 430. In step 430, adjust the protocol to mode 2. For example, mode 2 may be GSM communication. The various components of the receiver may be configured for mode 2 reception, as described above with respect to FIG. 3. Note that, as before, the mode switch may alternately be performed concurrently or prior to retuning the synthesizer. However, to allow retuning the synthesizer at the last possible moment (to minimize disruption to model communications), and to take advantage of the settling time of the synthesizer, in the exemplary embodiment, the mode change occurs subsequent to the synthesizer retune. Proceed to decision block 435, which loops back to itself until the frequency has stabilized. When the new frequency has stabilized to within a desired threshold, proceed to step 445. In an alternate embodiment, a timer may be used to generate a signal when a pre-determined time has expired. The pre-determined time may be programmed to according to the synthesizer settling time. The generated signal can be used to begin DC offset adjustment (details not shown).

In step 445, a DC offset adjustment is made. This may be carried out by estimating the DC component in the signal and subtracting that estimate. Any number of DC offset compensation stages may be deployed. In one embodiment, a single analog DC offset compensation block may be deployed. In another embodiment, examples of which are described above with respect to FIG. 2 and below with respect to FIGS. 5-6, a coarse and fine grain DC offset compensation is performed. In one embodiment, the coarse gain DC offset compensation is performed in the analog domain, and the residual fine gain DC offset compensation is performed digitally. Once DC offset compensation is complete, proceed to step 450.

In step 450, automatic gain control is activated. Note that, in some embodiments, DC offset compensation as just described may be configured to loop continuously (in whole or in part, such as fine grain DC offset compensation). In this case, DC offset compensation may be disabled during the AGC calibration. Any number of gain stages may be deployed throughout a receiver. In the exemplary embodiment, a coarse gain control is performed in an analog LNA, and fine gain control is performed in a digital VGA. After AGC has been performed (in whole or in part), proceed to decision block 455.

Note that various gain stages need not be adjusted simultaneously. For example, coarse AGC may be performed after an initial DC offset compensation, with subsequent DC offset compensation, followed by coarse AGC, and so on. Fine AGC may be deferred until the current gain calibration has converged to within a certain threshold. This example will be detailed further below with respect to FIGS. 5-6. If the gain calibration has not yet converged, proceed to step 440, disable AGC, and repeat DC offset compensation and the following steps detailed beginning in step 445 (as just described). Once gain calibration has converged, proceed to step 460. Note that, in one embodiment, the fine AGC may be deferred until after steps 440-445 have converged. Note further that once initial gain calibration, subsequent to a frequency change, has been completed, it may be common for AGC and DC offset compensation loops to continue to run, tracking changes in the communication channel as appropriate. In the exemplary embodiment, the fine gain DC offset compensation loop and fine AGC loop continue indefinitely during a communication session.

In step 460, measurements are performed at the new frequency. Various system measurements may be performed, as are known in the art. For example, simple received energy measurements may be performed to detect the existence of a system. Or, a system may be searched, and one or more available base stations may be located and channel quality estimates made. Once the desired measurements are completed, proceed to decision block 465.

It may be desirable to search a single frequency before returning to the original frequency, or, any number of frequency searches may be performed serially.

To illustrate this option, in decision block 465, if one or more additional frequency searches remain, return to step 415, disable gain calibration (as necessary) and repeat the frequency switch steps just described for each remaining frequency. Those of skill in the art will recognize that each search may be made according to any communication format and on any supported frequency. Once the searches are complete, in decision block 465, proceed to decision block 470.

While various embodiments have been described with the assumption that the original frequency will be returned to, the advantages of the fast frequency switch just performed are available whether searching on alternate systems is performed interspersed within a communication on one frequency (as described herein), or whether the receiver simply retunes and remains at the destination frequency. Decision block 470 illustrates this option. If the original frequency and mode are to be returned to (to continue an active communication session on that system, for example), proceed to step 475. If no return is desired, the process may stop.

In step 475, one or more saved state values (as saved in step 410) may be compensated for the time spent searching the alternate frequency. Techniques are known in the art for updating various parameters when the time offset is known. This step is optional. In an alternate embodiment, state values or parameters that would require delay compensation may be omitted from the state saving step 410. Proceed to step 480 to restore the saved and/or compensated state values to their respective components, as appropriate. Then return to step 415 to perform frequency switching, as just described, for the return frequency. Note that steps 475 and 480 may be performed concurrently with mode change step 430, subsequent to initiating synthesizer retune. When the frequency switch is complete (returning to the original frequency), the process will proceed through decision blocks 465 and 470 and stop, as any additional frequencies have already been searched, and the return process was initiated in the prior pass through decision block 470.

Method 400 is an exemplary embodiment of a frequency switching process that may be deployed periodically to perform measurements of neighboring cells and/or systems. Among other uses, it is well suited for deployment when limited time is available for such searching and/or measurement. Searching during compressed mode operation in a W-CDMA system is one such example.

Various embodiments may be deployed in varying receiver configurations. For example, it is common, as described above, for a receiver to perform some functions in the analog domain, and others in the digital domain. A mobile station may comprise one or more Integrated Circuits (ICs) among other components. (Integrated Circuits are also commonly referred to as Application Specific Integrated Circuits (ASICs), as well as other descriptors commonly known in the art). One or more analog ICs may be deployed. One or more digital ICs may be deployed. Or, mixed-mode ICs combining digital and analog functionality may be deployed. The principles of the present invention are applicable to any such configuration. Various aspects of the invention, particularly some control features that reduce frequency switch latency may be particularly useful in certain configurations.

Figure 5:
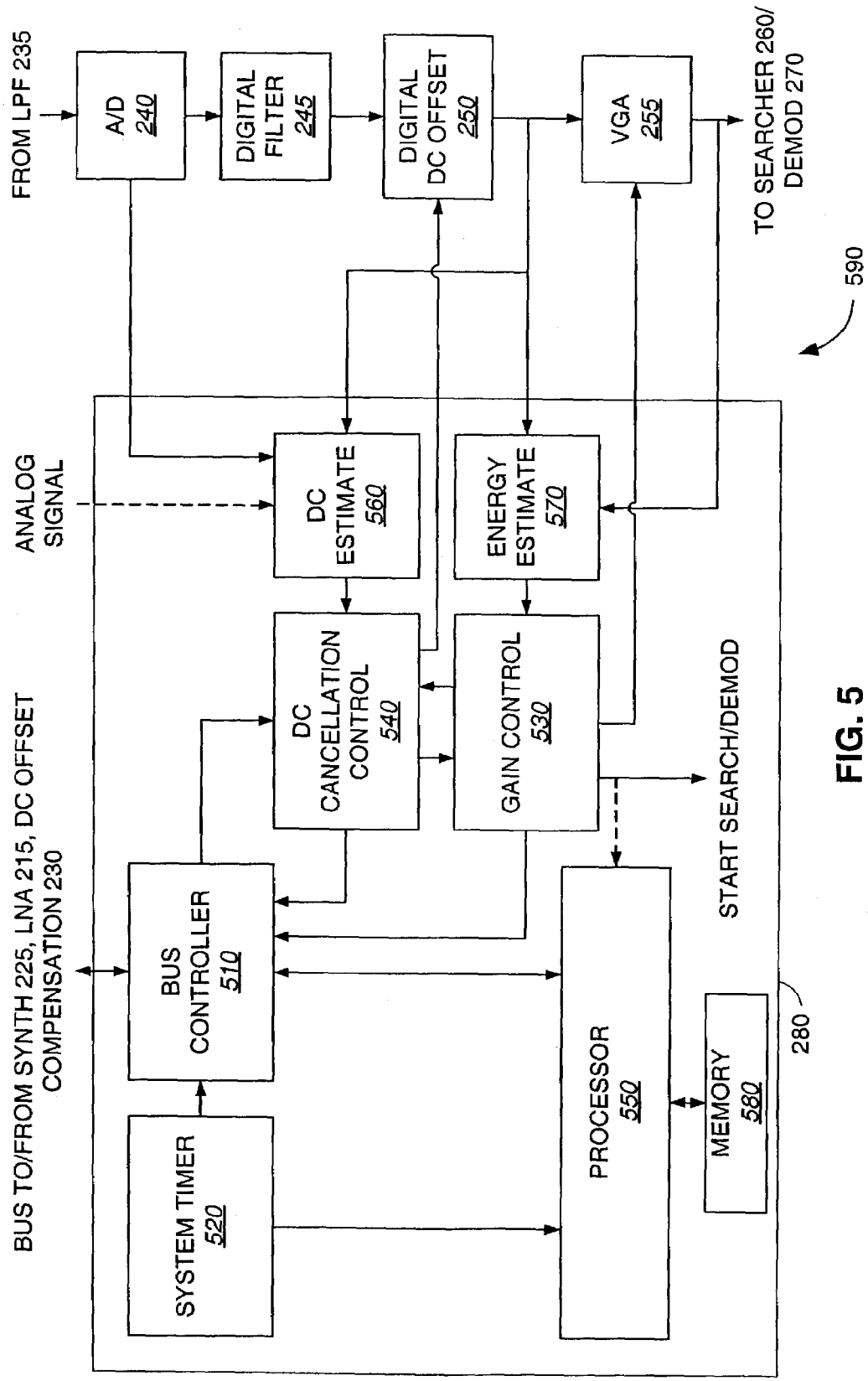
FIG. 5 is an exemplary embodiment of an ASIC utilizing frequency switching.

FIG. 5 depicts an exemplary embodiment of an IC 590 that includes several aspects of the present invention. IC 590 may be deployed as part of the mobile station 106 depicted in FIG. 2. The division of components between analog and digital, or on-IC and off-IC components, is depicted in FIG. 5 for illustrative purposes only. Those of skill in the art will recognize myriad combinations that fall within the scope of the present invention.

In the example of FIG. 5, IC 590 includes the majority of the digital processing described with respect to FIG. 2. In addition, the Analog to Digital (A/D) converter 240 is included. Searcher 260 and demod 270 (as well as additional digital and/or analog functionality, not shown in FIG. 2) may be included in IC 590, although they are not depicted in FIG. 5. LNA 215, mixer 220, synthesizer 225, DC offset compensation 230, and low pass filter (LPF) 235 are incorporated in one or more analog components or ICs, outside of IC 590. A bus is deployed between the various components of the mobile station, including the analog components and IC 590. As known in the art, a shared bus may be deployed to reduce specific interconnections between components. In all the embodiments described herein, a bus may be replaced with specific connections, and vice-versa. In some embodiments, direct connections for certain control signals, examples of which are described herein, may provide certain advantages. However, such configurations are not mandatory. Those of skill in the art will readily adapt the principles disclosed herein to any combination of components, buses, and interconnections.

In similar fashion as shown in FIG. 2, IC 590 includes a digital filter 245 for receiving the A/D 240 output. The output of digital filter 245 is delivered to digital DC offset block 250, which is directed via controller 280 to remove a residual DC signal component. The DC offset signal is then delivered to VGA 255, which amplifies the signal for use in searching and/or demodulation (searcher 260 and demod 270 are not shown, but may also be deployed in IC 590).

Controller 280 may include a variety of components, examples of which are depicted in FIG. 5 and detailed herein to describe the control of the frequency switching process. The components shown may be a subset of those deployed. The components are shown as discrete blocks for clarity of discussion only. Those of skill in the art will recognize that each component may be deployed as special-purpose hardware, or implemented with one or more special or general purpose processors, digital signal processors, or any combination of the above.

Processor 550 is included in controller 280. Processor 550 may be a generalpu-purpose microprocessor, a digital signal processor (DSP), or a special-purpose processor. Processor 550 may perform some or all of the functions of the other blocks depicted, as well as any other processing required by the wireless mobile station. Processor 550 may be connected with special-purpose hardware to assist in these tasks (details not shown). Data or voice applications may be run on a mobile station deploying IC 590, or in conjunction therewith, may be external, such as an externally connected laptop computer or connection to a network, may run on an additional processor within mobile station 106 (not shown), or may run on processor 550 itself. Processor 550 is connected with memory 580, which may be used for storing data as well as instructions for performing the various procedures and methods described herein. Those of skill in the art will recognize that memory 580 may be comprised of one or more memory components of various types, that may be embedded in whole or in part within processor 550. Although processor 550 may be connected with any or all of the components in IC 590 (as well as with components external to IC 590), a subset of the connections are shown in FIG. 5 as they relate to frequency switching. Processor 550 may be used to initialize or program one or more of the components described.

Bus controller 510 is connected to processor 550. In this exemplary embodiment, as described above, a bus is used to communicate with and control various components external to IC 590. The bus is shown connecting with, for example, synth 225, LNA 215, and DC offset compensation block 230. The bus may also be used to connect with components within IC 590 as well (details not shown). A system timer 520 is connected to bus controller 510 and processor 550. System timer 520 is used to maintain a timing reference. Any timing reference may be deployed, and various techniques for maintaining system time are well known in the art. In the exemplary embodiment, bus controller 510 is used to control components connected to the bus with relatively precise timing.

In the exemplary embodiment, processor 550 may direct bus controller 510 to issue a command (i.e. perform a write) on the bus at a specific time. This may be done by supplying an address to indicate the device to be controlled, the control value to be applied, and a time reference at which the command should be issued. The bus controller may then issue the command on the bus at the proper time using system timer 520 as the timing reference. One benefit of using a bus controller, as just described, is that latency experienced with a processor attempting to control components via a shared bus may be eliminated. For example, an interrupt-driven process for initiating the synthesizer to retune may introduce a varying amount of delay. By programming the bus controller to start a synthesizer retune using a certain command on the shared bus, addressed to the synthesizer, at the earliest available time, the frequency switch latency can be greatly reduced. An example of this process is detailed further below with respect to FIG. 6.

Bus controller 510 may contain additional logic for arbitrating between attempts by two or more components to access the bus simultaneously. However, in an exemplary embodiment of a method of low latency frequency switching, depicted in FIG. 6, the sequence of steps is selected to avoid bus contention, and thus arbitration is not needed in bus controller 510.

DC cancellation control block 540 is used to control the DC offset portion of the gain calibration phase of a frequency switch. DC cancellation control block 540 receives a DC estimate from DC estimate block 560. In response, it directs DC offset compensation block 230 to introduce an offset to counteract DC through bus controller 510, and directs digital DC offset block 250 to remove any residual DC component. While the shared bus, and bus controller 510, may be used to control digital DC offset block 250, in the exemplary embodiment a direct connection between DC cancellation control 540 and digital DC offset block 250 is deployed since both components are on the same chip.

In the exemplary embodiment, one DC estimate, in DC estimate block 560, may be made from the output of A/D converter 240. The output may be the entire A/D output, or an intermediate A/D output. For example, a single bit stream may be produced in the A/D converter 240, and then integrated over a number of samples to get an indication of the DC component in the signal. Various other DC measurement techniques are known in the art, all of which fall within the scope of the present invention. A dashed input to DC estimate 560 shows another alternative, in which an analog signal is delivered and a DC estimate is made from the analog signal. This first DC estimate is referred to as the coarse DC estimate. DC estimate block 560 may also generate a DC estimate from the output of digital DC offset block 250. This second DC estimate is referred to as the fine DC estimate. Either or both of the fine and coarse DC estimates may be made available to DC cancellation control 540. Note that a discrete DC estimate block 560 is depicted for clarity of discussion only. This block may be incorporated into one or more other blocks, described herein, as will be apparent to one of ordinary skill in the art.

Gain control 530 is used to control the Automatic Gain Control (AGC) portion of the gain calibration phase of a frequency switch. Gain control 530 controls the gain value in LNA 215 via the shared bus and bus controller 510. This is referred to herein as coarse AGC control. Gain control 530 also controls VGA 255, with a direct connection in the exemplary embodiment (as with other components, the shared bus could alternatively be used to control VGA 255). This is referred to herein as fine AGC control. While two gain stages, fine and coarse, are described in the exemplary embodiment, those of skill in the art will recognize that various gain stages may be distributed throughout a receiver, both analog and digital, and any number of gain stages may be controlled to apply the appropriate gain to the received signal.

Gain control 530 makes decisions to increase or decrease the gain in one or more gain stages in response to an energy estimate 570. Energy estimate 570 receives the output of the digitally DC offset compensated signal from digital DC offset block 250. This energy value will be used in performing coarse AGC. In addition, energy estimate block 570 may produce an energy estimate based on the output of VGA 255 to be used in fine AGC. As with other components, energy estimate block 570 is depicted as a discrete component for clarity of discussion only. In alternate embodiments, an energy estimate may be made in one or more of the other blocks in the receiver. Energy estimating techniques are well known in the art. Those of skill in the art will know how to perform gain control to make optimal use of the dynamic range of the particular embodiment deployed.

Note further that gain control 530 produces a signal to start a search or demodulation process. This is to facilitate low latency frequency switching, since the gain control 530 is the first component to know that the gain calibration phase is complete and the received signal is ready for demodulation. An alternative, as shown by the dashed line, is to send a signal to processor 550 to indicate the searching and/or demodulating processes may begin.

In this exemplary embodiment, DC cancellation control 540 and gain control 530 are directly connected with two signals. In addition, a signal from bus controller 510 is connected to DC cancellation control 540. One or more of these signals may be deployed in various embodiments to facilitate low latency frequency switching, an example of which is detailed further below with respect to FIG. 6. As described above, gain calibration does not begin until the synthesizer (synth 225) has retuned its frequency to within a desired threshold. The range of time to allocate for synthesizer retune may be determined in advance, based on various system parameters. The bus controller 510 may signal the DC cancellation control 540 when a synthesizer retune command has been issued on the shared bus. (Recall that this can be quite precisely timed following a command from processor 550, in conjunction with system timer 520). In the exemplary embodiment, DC cancellation control 540 contains a timer that may be programmable with the expected time required for the synthesizer to settle. When the timer expires, gain calibration may begin. Thus, latency between frequency settling and gain calibration may be minimized. (Various alternate embodiments will be readily apparent to those of skill in the art. For example, the timer may be incorporated in bus controller 510, and the signal to DC cancellation control 540 is a signal to initiate gain calibration.)

As described above, gain control may be suspended while DC offset calibration is being performed. Similarly, DC offset compensation may be fixed while AGC is being performed. The two signals between DC cancellation control 540 and gain control 530 may be used to handshake between the two processes, which may iterate one or more times before gain calibration is complete. Note that the processor 550 does not need to intervene in these iterations, thus any related latency is avoided. As one example, DC cancellation control 540 may signal gain control 530 to change LNA state (i.e. coarse gain control, effected through bus controller 510). Once the AGC stage is complete, gain control 530 may signal the DC cancellation control 540 (or alternatively, DC estimate 560, details not shown), to begin integration. Each respective block may suspend operation after signaling the other to begin, until the corresponding handshake signal is received to indicate its operation should continue.

Figure 6:
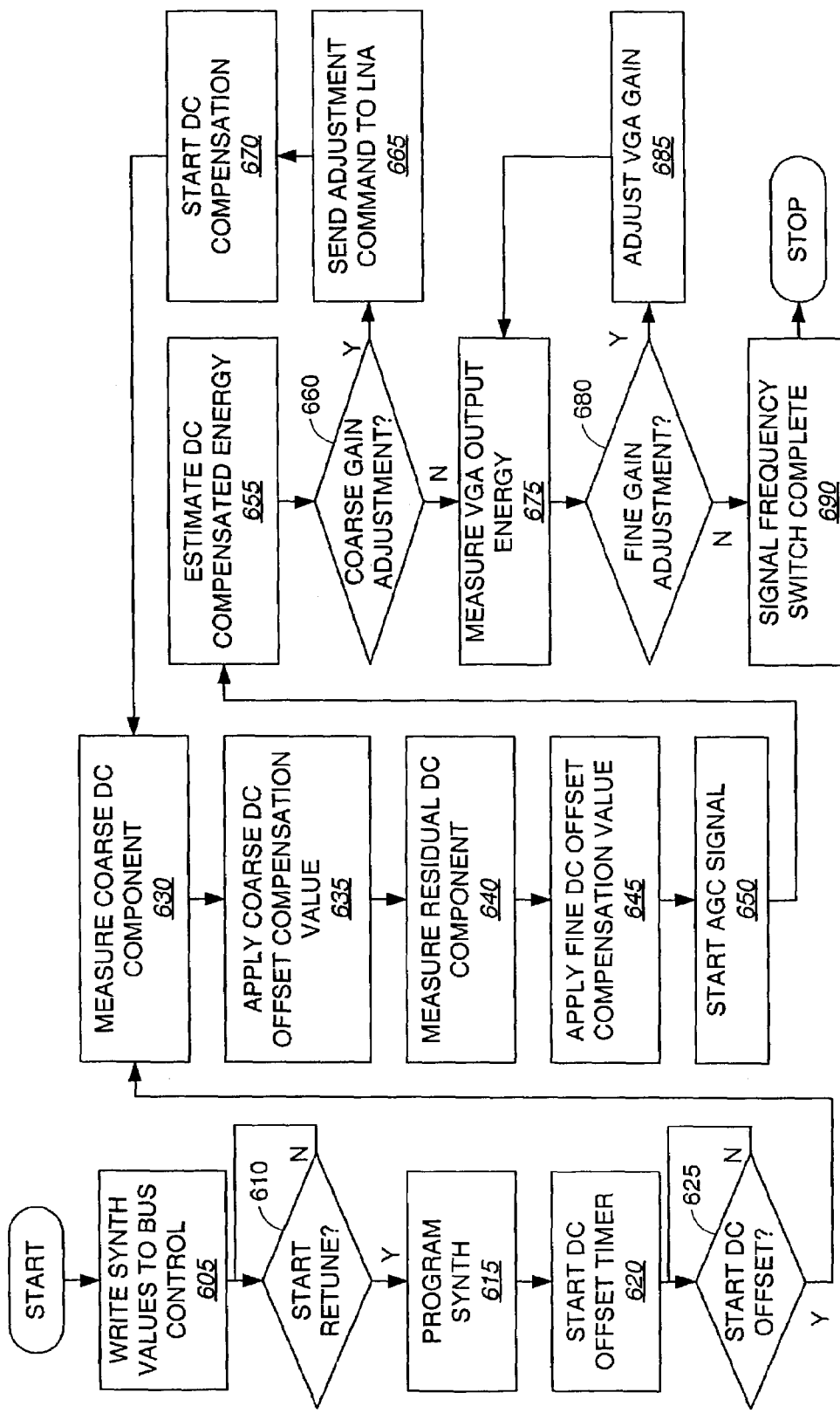
FIG. 6 is an exemplary embodiment of a method of low latency frequency switching.

FIG. 6 is an exemplary method of low latency frequency switching 600. This embodiment illustrates the use of various aspects just described with respect to FIG. 5. Those of skill in the art will readily adapt the principles of this example to various other receiver configurations. For example, a subset of the features described in FIG. 5 may be deployed, and the benefits of the deployed aspects may still be realized. Note that the steps of method 600 may be readily adapted to method 400 depicted in FIG. 4, as well as any other frequency switching algorithms known or developed in the future.

Method 600 begins in step 605, in which the appropriate values for a synthesizer retune are written to bus controller 510 (i.e., written by processor 550). In addition to parameters required to select the desired frequency, and the appropriate address (or other selection mechanism) for indicating the command is for the synthesizer, a precise time for the synthesizer retune to begin may be programmed. This allows a processor, such as processor 550, to program the frequency switch well in advance of the earliest retune time available, thus removing the processor's latency characteristics from the overall frequency switch time calculation.

In decision block 610, the process waits until the programmed time arrives for the synthesizer retune to begin. A system timer such as system timer 520 may be used to determine when the appropriate time has arrived. Various techniques are well known in the art. For example, the bus controller may compare the system time with the programmed time value, and generate a signal when they are equal. Or, a timer may be programmed with an initial value based on the desired start time and the system time at the time the command is received. The retune will be initiated when the timer expires.

In step 615, the synthesizer is programmed to begin the retune to the new frequency. In the exemplary embodiment, a shared bus is deployed. The bus controller sends a command to the synthesizer on the shared bus, directing it to retune to the new frequency. In an alternative embodiment, the synthesizer may be directly controlled with a dedicated connection (in such an embodiment, the use of the descriptor "bus controller" may be somewhat of a misnomer, but those of skill in the art will readily adapt the principles herein to both shared bus, direct connected, and hybrids of the two types in various receiver embodiments.)

Step 620 may be carried out simultaneously with step 615. In step 620, a DC offset timer is started after having been initialized with a value in accordance with the expected settling time of the synthesizer. In the exemplary embodiment of FIG. 5, the timer is deployed in DC cancellation control 540 and begins to count once the direct signal from bus controller 510 is activated indicating the synthesizer retune command was generated. The timer may be incorporated in alternate blocks, in alternate embodiments. In yet another alternate embodiment, DC cancellation control 540 may be programmable with a start time, which, when used in conjunction with system timer 520, may indicate when gain calibration is to begin. Proceed to decision block 625, in which the process waits until DC offset calibration is to begin, then proceeds to step 630.

In step 630, the coarse DC component is measured. This may be performed using any DC measurement method, examples of which are detailed above with respect to FIG. 5. Proceed to step 635 to apply the appropriate compensation value to offset the measured DC value. In the exemplary embodiment, this coarse DC compensation offset value is programmed in DC offset compensation block 230 via bus controller 510.

In step 640, the residual DC component is measured. Proceed to step 645 to apply a fine DC offset compensation value to offset the residual DC component. In the exemplary embodiment, the fine DC component offset is removed in digital DC offset 250, which is controlled directly since it is on-chip (in an alternate embodiment, a shared bus could be used). Those of skill in the art will recognize that a DC offset value, either fine or coarse, may be distributed between two or more DC offset blocks. In another alternative, a single DC offset compensation block may be deployed, if it is determined to be of sufficient sensitivity. Once these DC offset compensation steps are completed, proceed to step 650.

In step 650, a start AGC signal is activated to indicate that DC calibration (at least the current iteration) is complete. In the exemplary embodiment, DC cancellation control 540 will signal gain control 530 to begin AGC steps. In step 655, estimate the DC compensated energy.

In decision block 660, determine if a coarse gain adjustment is required. In the exemplary embodiment, this equates to a selection of one of the LNA gain stage configurations, of which there will be a limited number. If coarse gain adjustment is in order, proceed to step 665. In step 665, send an adjustment command to the LNA. This may be performed with the shared bus via bus controller 510. (In an alternate embodiment, a direct connection may be used.) Once an LNA adjustment is made, DC calibration will be re-run on the new configuration. Proceed to step 670 and signal DC cancellation control to run again. AGC will suspend. The process then repeats as just described until decision block 660 is reached once more.

In decision block 660, if no additional coarse adjustment remains to be made, proceed to step 675 to perform fine AGC. In step 675, measure the output of the VGA (i.e. VGA 255). If an adjustment is necessary, in step 680, proceed to step 685 and adjust the VGA gain accordingly. Then proceed back to step 675 to measure the VGA output energy once more. After no more fine gain adjustments are necessary, proceed to step 690.

In step 690, signal that the frequency switch is complete. A signal may be directed to begin searching and/or measuring at the new frequency, as described above with respect to FIG. 4. Signaling the search to start as early as possible may reduce frequency-switch latency. Then the process may stop.

Note that the coarse AGC may be used to get the gain quickly to a range that is somewhat close to the desired range. In the exemplary embodiment, it uses dedicated hardware to minimize latency. Fine AGC may be performed over longer periods of time, using averages to get a tighter lock. Although perhaps less timely, fine AGC may be good for long term stability, accuracy, etc. In the exemplary embodiment, fine AGC is deployed using a mixture of dedicated hardware and shared hardware (i.e. firmware in a DSP). Note further that while fine DC offset compensation and AGC are described above with relation to a frequency switch, those loops may continue to run at the new frequency to track changes in the communication channel.

It should be noted that in all the embodiments described above, method steps can be interchanged without departing from the scope of the invention. The descriptions disclosed herein have in many cases referred to signals, parameters, and procedures associated with the W-CDMA and GSM standards, but the scope of the present invention is not limited as such. Those of skill in the art will readily apply the principles herein to various other communication systems. These and other modifications will be apparent to those of ordinary skill in the art.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
   a synthesizer configured to generate an output signal having a frequency in accordance with a tuning signal;
   a receiver configured to process a received signal in accordance with at least two communication modes; and
   a processor configured to provide the tuning signal to the synthesizer to tune the synthesizer from a first frequency corresponding to a first communication mode to a second frequency corresponding to a second communication mode and to adjust the receiver from the first communication mode to the second communication mode prior to a synthesizer settling to the second frequency.

2. The apparatus of claim 1, wherein the first communication mode corresponds to a first communication technology and the second communication mode corresponds to a second communication technology.

3. The apparatus of claim 2, wherein the first communication technology is in accordance with W-CDMA and the second communication technology is in accordance with GSM.

4. The apparatus of claim 1, wherein the processor is further configured to adjust the receiver component from the first communication mode to the second communication mode after providing the tuning signal.

5. The apparatus of claim 1, wherein receiver comprises a plurality of receiver components.

6. The apparatus of claim 5, wherein at least one of the plurality of receiver components is an analog to digital (A/D) converter.

7. The apparatus of claim 5, wherein at least one of the plurality of receiver components is a low noise amplifier (LNA).

8. The apparatus of claim 1, wherein the processor is configured to adjust the receiver from the first communication mode to the second communication mode by setting filter tap values.

9. The apparatus of claim 1, wherein the processor is configured to adjust the receiver from the first communication mode to the second communication mode by setting filter tap values.

10. The apparatus of claim 1, wherein the processor is configured to adjust the receiver from the first communication mode to the second communication mode by changing multiplexing functions.

11. The apparatus of claim 1, wherein the processor is further configured to provide another re-tuning signal to the synthesizer to tune the synthesizer from the second frequency to the first frequency and to adjust the receiver from the second communication mode to the first communication mode prior to a synthesizer settling to the first frequency.

* * * * *